(12) United States Patent
Kodama (10) Patent No.: US 12,484,151 B2
(45) Date of Patent: Nov. 25, 2025

(54) ELECTRONIC DEVICE (71) Applicant: GOERTEK TECHNOLOGY CO., LTD., Shandong (CN)

(72) Inventor: Kenichiro Kodama, Shandong (CN)

(73) Assignee: GOERTEK TECHNOLOGY CO., LTD., Shandong (CN)

( * ) Notice: Subject to any disclaimer, the term of this patent is extended or adjusted under 35 U.S.C. 154(b) by 291 days.

(21) Appl. No.: 18/043,356

(22) PCT Filed: Sep. 7, 2020

(86) PCT No.: PCT/CN2020/113685
§ 371 (c)(1),
(2) Date: Feb. 28, 2023

(87) PCT Pub. No.: WO2022/047766
PCT Pub. Date: Mar. 10, 2022

(65) Prior Publication Data
US 2024/0032196 A1    Jan. 25, 2024

(51) Int. Cl.
*H05K 1/02* (2006.01)
*H05K 1/14* (2006.01)
(52) U.S. Cl.
CPC ............ *H05K 1/142* (2013.01); *H05K 1/025* (2013.01); *H05K 1/028* (2013.01); *H05K 2201/10045* (2013.01); *H05K 2201/10098* (2013.01); *H05K 2201/10196* (2013.01)

(58) Field of Classification Search
CPC ......... H05K 1/145; H05K 1/028; H05K 1/025
See application file for complete search history.

(56) References Cited

U.S. PATENT DOCUMENTS

2004/0201423 A1*  10/2004  Weigand ............... H03F 1/30
                                                              330/307
2020/0015701 A1    1/2020  Wei et al.

FOREIGN PATENT DOCUMENTS

| CN | 103367864 A | 10/2013 |
| CN | 104620501 A | 5/2015 |
| CN | 110012404 A | 7/2019 |
| WO | 2011120349 A9 | 12/2011 |

* cited by examiner

Primary Examiner — Jeremy C Norris
(74) Attorney, Agent, or Firm — Ingrassia Fisher & Lorenz, LLP (57) ABSTRACT An electronic device includes a first circuit operating on a first signal of a first frequency and a second circuit operating on a second signal of a second frequency. The first signal is different from the second signal, and the first circuit and the second circuit share a first component. The first component functions as an antenna for the second circuit, which reduces space occupied by a dedicated or independent antenna and achieves smaller size and better industrial design for the electronic device.

18 Claims, 7 Drawing Sheets

ELECTRONIC DEVICE

CROSS-REFERENCE TO RELATED APPLICATION

This Application is a U.S. National-Stage entry under 35 U.S.C. § 371 based on International Application No. PCT/CN2020/113685, filed Sep. 7, 2020 which was published under PCT Article 21(2), which is hereby incorporated herein in its entirety by reference.

TECHNICAL FIELD

This application pertains to the technical field of electronics, and in particular to an electronic device with smaller size and better industrial design.

BACKGROUND

Electronic device are provided with more and more functions, and some of these functions may occupy large physical space. For example, cellphones are provided with more cameras, some of which may have large light-sensing areas and thus need more space in a cellphone. This will do harm to reduction of size and weight of electronic device and thereby result in poor industrial design thereof, especially for wearable devices in which smaller size and weight are desired for better user experience, such as wireless earbuds and smart watches. In addition, other objects, desirable features and characteristics will become apparent from the subsequent summary and detailed description, and the appended claims, taken in conjunction with the accompanying drawings and this background.

SUMMARY

In view of the above, the present disclosure provides an electronic device with smaller size and better industrial design to address the technical problem mentioned above.

According to some embodiments of the present disclosure, an electronic device is provided. The electronic device includes a first circuit operating on a first signal of a first frequency and a second circuit operating on a second signal of a second frequency, where the first frequency is different from the second frequency, and the first circuit and the second circuit share a first component.

In some embodiments of the present disclosure, the second signal is a radio frequency (RF) signal and the first component is an antenna for the radio frequency signal.

In some embodiments, the first circuit includes an output unit, the antenna is arranged between the output unit and a point of joint connection of the first and second circuits.

In some embodiments of the present disclosure, the first circuit includes a first terminal and a second terminal, and a first filter arranged between the second terminal and a point of joint connection of the first and second circuits, where the first filter is configured to filter out radio frequency signals.

In some embodiments of the present disclosure, the second circuit includes a third terminal and a capacitor arranged between the point of joint connection and the third terminal.

In some embodiments of the present disclosure, the output unit includes a second filter configured to filter out radio frequency signals.

In some embodiments of the present disclosure, the second circuit further includes an antenna matching circuit between the point of joint connection and the third terminal.

In some embodiments of the present disclosure, the second circuit further includes a third filter arranged between the output unit and the antenna and at a first predetermined distance from the output unit, where the third filter is configured to filter out radio frequency signals and the first predetermined distance is smaller than a distance between the third filter and the antenna.

In some embodiments of the present disclosure, the first circuit further includes a fourth filter configured to filter out radio frequency signals, where the fourth filter is arranged between the output unit and the first terminal and at a second predetermined distance from the output unit, wherein the second predetermined distance is smaller than a distance between the fourth filter and the first terminal.

In some embodiments of the present disclosure, the electronic device further includes a printed circuit board (PCB), where the first to third terminals are arranged on an integrated circuit on the PCB, the first circuit further comprise a fifth filter arranged on the PCB and between the fourth filter and the first terminal, where the fifth filter is configured to filter out radio frequency signals.

In some embodiments of the present disclosure, the electronic device further includes a RF module, where the third terminal is connected to the RF module.

In some embodiments of the present disclosure, the RF module is a Bluetooth module, a wireless LAN module or a GPS module.

In some embodiments of the present disclosure, the electronic device further includes a housing with a metal chassis, wherein the metal chassis is connected to a grounding terminal on the PCB by a contact component.

In some embodiments of the present disclosure, the first signal is an audio signal and the output unit is a speaker.

In some embodiments of the present disclosure, the first to the fifth filters each are a Ferrite bead or a choke coil.

In some embodiments of the present disclosure, the antenna is a cable or a flexible printed circuit connecting the output unit to the point of joint connection.

In some embodiments of the present disclosure, the antenna is a signal line printed on the PCB, and the signal line is a strip line or a micro strip line.

In some embodiments of the present disclosure, the first signal is an image signal and the output unit is a display.

In some embodiments of the present disclosure, the electronic device further includes a third circuit operating a third signal of a third frequency, wherein the first and third circuits share a second component of the first circuit, the third signal is a radio frequency signal, and the second component is an antenna for the radio frequency signal.

According to some embodiments of the present disclosure, an electronic device is provided. The electronic device includes a housing, a PCB, an output unit mounted on the housing, and a first antenna. The first antenna operates on a radio frequency signal, the output unit operates on a signal of a frequency that is different from a radio frequency, and the output unit is connected to a first output port on the PCB for the output unit through the first antenna.

In some embodiments of the present disclosure, the housing includes a metal chassis and a non-metallic portion, and the non-metallic portion encompasses at least the first antenna.

In some embodiments of the present disclosure, the housing is made of a non-metallic material.

In some embodiments of the present disclosure, the first antenna is a cable or a flexible printed circuit connecting the output unit to the first output port on the PCB.

In some embodiments of the present disclosure, the first antenna is a signal line printed on the PCB, and the signal line is a strip line or a micro strip line.

In some embodiments of the present disclosure, a length of the first antenna is between 15 mm to 35 mm.

In some embodiments of the present disclosure, the metal chassis is connected to a grounding terminal on the PCB by a contact component.

In some embodiments of the present disclosure, the electronic device is a wireless earbud and the output unit is a speaker of the wireless earbud.

In some embodiments of the present disclosure, the electronic device is a smart watch or a smart band, and the output unit is a display of the smart watch or smart band.

In some embodiments of the present disclosure, the electronic device further includes a second antenna, where the output unit is further connected to a second output port on the PCB for the output unit through the second antenna.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

The technical solution of the present disclosure is hereinafter described with reference to the accompanying drawings. It is evident that the embodiments are only some exemplary embodiments of the present disclosure, and the present disclosure is not limited to such embodiments. Other embodiments that those skilled in the art obtain based on embodiments of the present disclosure also all within the protection scope of the present disclosure.

The present disclosure provides an electronic device with smaller size and better industrial design by sharing some components among multiple circuits with distinct functions in the electronic device, so as to address the disadvantages of the conventional art mentioned in the background section.

Figure 1:
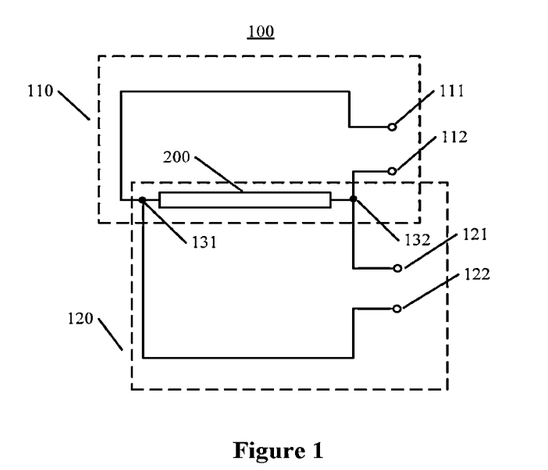
FIG. 1 is a schematic diagram of an electronic device according to an embodiment of the present disclosure.

As shown in FIG. 1, an electronic device 100 is provided according to an embodiment of the present disclosure. The electronic device 100 includes a first circuit 110 and a second circuit 120, and the first circuit 110 and the second circuit 120 may have different functions in the electronic device 100. The first circuit 110 operates on a first signal and the second circuit 120 operates on a second signal. The first circuit 110 and the second circuit 120 have a first point 131 of joint connection and a second point 132 of joint connection, and a first electronic component 200 is arranged between the first point 131 of joint connection and the second point 132 of joint connection. As shown in FIG. 1, the first electronic component 200 is shared by the first circuit 110 and the second circuit 120, that is, both the first circuit 110 and the second circuit 120 includes the first electronic component 200.

The first circuit 110 has a first terminal 111 and a second terminal 112, and the second circuit 120 has a third terminal 121 and a fourth terminal 122. The first signal may be provided from the first terminal 111 to the second terminal 112 through the first electronic component 200 or from the second terminal 112 to the first terminal 111 through the first electronic component 200, and the second signal may be provided from the third terminal 121 to the fourth terminal 122 through the first electronic component 200 or from the fourth terminal 122 to the third terminal 111 through the first electronic component 200.

Although not shown in FIG. 1, it is well appreciated that the first circuit and second circuit may include other components in addition to the first electronic component so as to realize their respective functions.

The first signal may be different from the second signal in terms of any of various parameters. For example, the first signal has a first frequency, the second signal has a second frequency, and the first frequency may be different from the second frequency. The functions of the first and second circuits may be related to the first frequency and the second frequency so as to be different from each other since the first frequency is different from the second frequency. For example, in some embodiments, the first signal may be an audio signal, and accordingly the first frequency may typically range from 20 Hz to 20 kHz; and the second signal may be a radio frequency signal, and accordingly the second frequency may typically range from 300 kHz to 300 GHz, more preferably from 100 MHz to 300 GHz.

By the configuration of such an electronic device as disclosed in the above embodiment, smaller size and better industrial design can be achieved for the electronic device, as different circuits implementing different functions in the electronic device share at least one common component.

As noted above, the first electronic component 200 is shared by the first circuit 110 and the second circuit 120, and may perform different functions in the first circuit 110 and the second circuit 120, which will be further detailed hereinafter.

Figure 2:
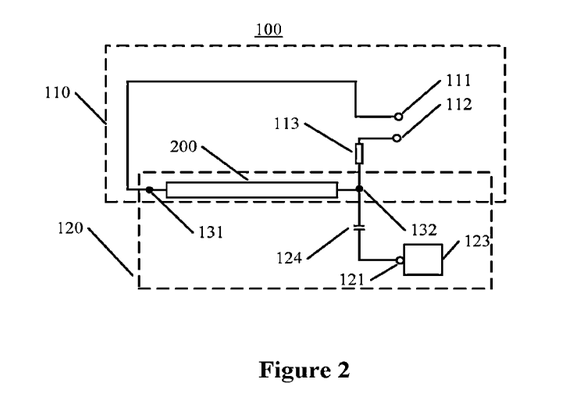
FIG. 2 is a schematic diagram of an electronic device according to an embodiment of the present disclosure.

In an embodiment based on the above embodiment, the first circuit 110 may be an audio circuit, and accordingly the first signal is an audio signal. As shown in FIG. 2, the first circuit 110 includes a first terminal 111, a second terminal 112, and the first electronic component 200 among other components. As shown in FIG. 2, the first electronic component 200 constitutes a portion of an electric path connecting the first terminal 111 to the second terminal 112. In practical application, the first circuit 110 may further includes a speaker, the first terminal 111 and the second terminal 112 may be speaker ports that feed the audio signal to the speaker; and accordingly, the first electronic component 200 may be a cable or a flexible printed circuit that connects the speaker to the second terminal 112. As can be seen, the first electronic component 200 functions as a conductive member that completes the first circuit 110, to allow the audio signal to be fed to the speaker.

The second circuit 120 may be a radio frequency circuit, and accordingly, the second signal is a radio frequency signal. As shown in FIG. 2, the second circuit 120 includes a third terminal 121 and the first electronic component 200 among other components. The first electronic component 200 functions as an antenna in the second circuit 120, which converts an electromagnetic wave into a radio frequency signal and coverts a radio frequency signal into an electromagnetic wave for propagation in space. Understandably, the third terminal 121 is connected to a radio frequency module 123, which makes the third terminal 121 a RF terminal, where the radio frequency module 123 feeds a radio frequency signal to the antenna (i.e., the first electronic component 200) and receives a radio frequency signal from the antenna for processing.

According to the above embodiment, the first electronic component 200 is multiplexed in the first circuit 110 and the second circuit 120, and functions as an antenna in the second circuit 120. By contrast, in conventional technology, the above functions implemented by the first electronic component 200 in the first circuit 110 and the second circuit 120 are performed by a cable or flexible printed circuit and a dedicated or independent antenna, respectively. Therefore, by the configuration as described in the above embodiments of the present disclosure, no dedicated or independent antenna is required and smaller size and better industrial design can be achieved in the electronic device 100 according to the present disclosure.

In practice, in order to reduce or minimize interference between the first signal and the second signal, with further reference to FIG. 2, a first filter 113 is provided between the second point 132 of joint connection and the second terminal 112 of the first circuit 110, and a capacitor 124 is provided between the second point 132 of joint connection and the third terminal 121 (i.e., the RF terminal). The first filter 113 may be a low pass filter or a band pass filter that allows only passage of low frequency signals and filters out high frequency signals. In this embodiment, the first filter 113 allows passage of the first signal of the first frequency but filters out the second signal which is a radio frequency signal, and the capacitor 124 is configured to prevent the first signal of the first frequency from entering the RF terminal. In some embodiments, the first filter 113 may be a Ferrite bead or a choke coil which can implement the above-described functions of the filter 113. In some embodiments, a high pass filter or band pass filter for filtering out the first signal may be further provided between the second point 132 of joint connection and the third terminal 121.

Figure 3:
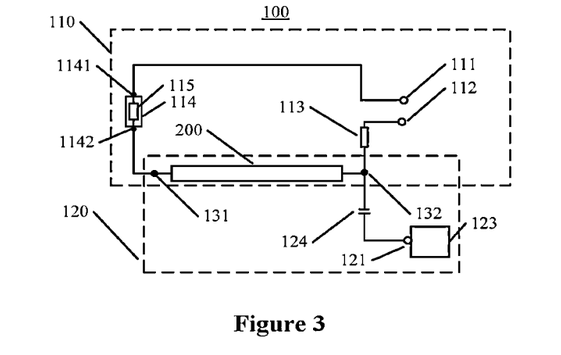
FIG. 3 is a schematic diagram of an electronic device according to an embodiment of the present disclosure.

As can be understood, the first circuit 110 may further include an output unit 114 in order to implement its function, as shown in FIG. 3. For example, the output unit 114 may be an audio output unit, such as a speaker, or the output unit 114 may be an image output unit, such as a display. Apparently, the output unit may be any other functional unit as may be needed by those skilled in the art.

The output unit 114 is arranged between the first terminal 111 of the first circuit 110 and the first point 131 of joint connection, and has a fifth terminal 1141 connected to the first terminal 111 of the first circuit 110 and a sixth terminal 1142 connected to the first point 131 of joint connection. In some embodiments, the sixth terminal 1142 and the first point 131 of joint connection may be formed as one, and the antenna 200 may be arranged between the sixth terminal 1142 and the second point 132 of joint connection.

In practice, the output unit 114 may include a second filter 115 between the fifth terminal 1141 and the sixth terminal 1142 of the output unit 114. The second filter 115 may be a low pass filter or a band pass filter that allows only passage of low frequency signals and filters out high frequency signals. In this embodiment, the second filter 115 allows passage of the first signal of the first frequency but filters out the second signal which is a radio frequency signal. In some embodiments, the second filter 115 may be a Ferrite bead or a choke coil. For example, the second filter 115 may be a coil in a speaker in a case that the first signal is an audio signal and the output unit 114 is a speaker. By configuring the electronic device 100 as described above, performance of the first circuit and the second circuit can be guaranteed.

For a better understanding of the operation of the electronic device with the configuration as described above, provision of the first signal and the second signal is explained with reference to FIGS. 4a and 4b, respectively.

Figure 4A:
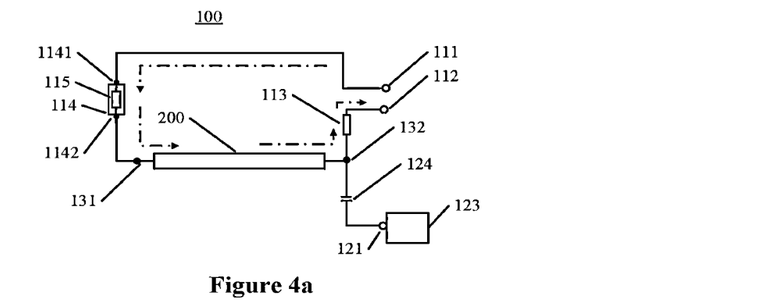
FIG. 4a is a schematic diagram of an electronic device according to an embodiment of the present disclosure.
Figure 4B:
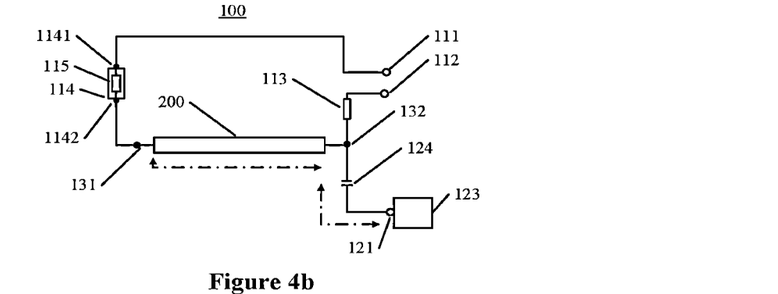
FIG. 4b is a schematic diagram of an electronic device according to an embodiment of the present disclosure.

As shown in FIG. 4a, the first signal may flow out of the first terminal 111 of the first circuit 110, pass the output unit 114 and reach the second point 132 of joint connection after passing the first point 131 of joint connection and the antenna 200 in sequence. Due to the existence of the capacitor 124, the first signal cannot reach the third terminal 121 (i.e., the RF terminal) of the second circuit 120, but arrives at the second terminal 112 of the first circuit 110 through the first filter 113.

The antenna can transmit and receive electromagnetic waves. In transmission, the antenna converts a RF signal from the RF module 123 into an electromagnetic wave and transmits the electromagnetic wave into space; in reception, the antenna receives an electromagnetic wave from space, converts the received electromagnetic wave into a RF signal and provides the RF signal to the RF module 123 for processing. With configuration as described above, the second signal which is a RF signal is filtered out by the first filter 113 arranged between the second point 132 of joint connection and the second terminal 112 of the first circuit 110 and by the second filter 115 in the output unit 114. Thus, as shown in FIG. 4b, the second signal may only flow from the third terminal 121 to the antenna 200 through the capacitor 124 and the second point 132 of joint connection in a case that the antenna is transmitting, or from the antenna 200 to the third terminal 121 through the second point 132 of joint connection in a case that the antenna is receiving, but cannot enter the first terminal 111 or the second terminal 112 of the first circuit 110 due to the existence of the first filter 113 and the second filter 115.

Figure 5:
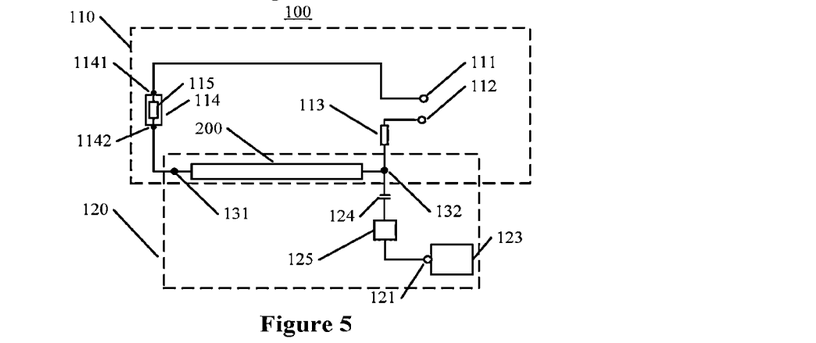
FIG. 5 is a schematic diagram of an electronic device according to an embodiment of the present disclosure.

During operation of the antenna 200, impedance matching is desired for the antenna to eliminate reflections of transmitted signals back to a feed line. In some embodiment, an antenna matching circuit 125 may be further provided in a feed line for the antenna, as is shown in FIG. 5. Typically, the antenna matching circuit 125 is so provided that an impedance of the feed line for a mobile device is 50 Ohm(Ω), thereby achieving impedance matching for the antenna 200.

Figure 6:
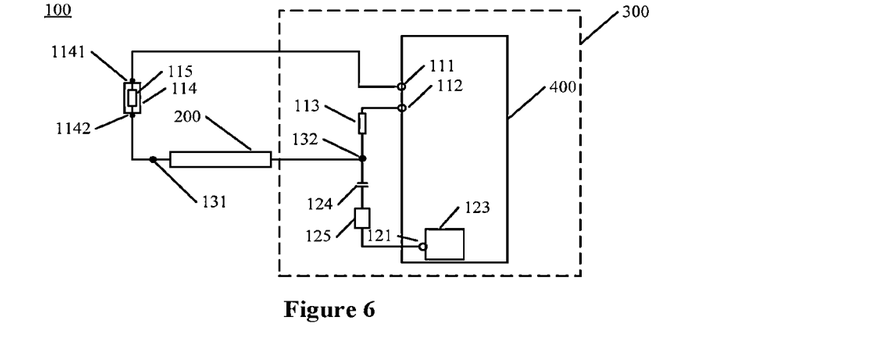
FIG. 6 is a schematic diagram of an electronic device according to an embodiment of the present disclosure.

The electronic device 100 may further include a printed circuit board (PCB) 300, as shown in FIG. 6. An integrated circuit (IC) 400 is provided on the PCB 300, and the first terminal 111, the second terminal 112 of the first circuit 110 and the third terminal 121 of the second circuit 120 are connected to the IC 400. In a particular embodiment, the first terminal 111 and the second terminal 112 are connected to a first module which is arranged on the IC 400 for providing the first signal. It is well appreciated that the first module may vary depending on functionality of the first circuit 110. For example, in a case that output unit 114 is a speaker, the first module may be an audio module having a first speaker port and a second speaker port respectively connected to the first terminal 111 and the second terminal 112. The third terminal 121 is connected to a first RF module 123 on the IC 400, where the first RF module 123 is configured to generate a RF signal and provide the generated RF signal to the antenna in a case that the antenna is in transmission, and receive a RF signal from the antenna and process the received RF signal in a case that the antenna is in reception. The first RF module 123 may be a cellular module, a Bluetooth module, a wireless LAN (Local Area Network) module or a GPS module depending on specific implementation of the invention by those skilled in the art, which is not limited in the present disclosure.

In an embodiment, the second point 132 of joint connection, the first filter 113, the capacitor 124 and the antenna matching circuit 125 may also be arranged on the PCB 300. The feed line may be a strip line or a micro strip line printed on the PCB 300 by such means as is well appreciated by those skilled in the art, which is not elaborated herein for purpose of brevity. With reference to the description above, the capacitor 124 and the antenna matching circuit 125 are arranged at the feed line.

The first circuit 110 includes a first branch defined between the fifth terminal 1141 of the output unit 114 and the first terminal 111, and a second branch defined between the sixth terminal 1142 of the output unit 114 and the second terminal 112. In an embodiment, the first branch may include a first section that is provided on the PCB 300 and a second section that is provided outside the PCB 300. The second branch includes a third section that is provided on the PCB 300 and a fourth section that is provided outside the PCB 300, where according to the above description, the fourth section also functions as the antenna 200 of the second circuit 120. With reference to the description above, the first filter 113 is arranged at the third section.

The first section of the first branch and the third section of the second branch each may be a signal line printed on the PCB 300 by such means as is known to those skilled in the art, and the signal line may be a strip line or a micro strip line printed on the PCB 300.

The second section of the first branch and the fourth section of the second branch each may be a cable or a flexible printed circuit connecting the output unit 114 to the first section and the third section printed on the PCB 300. In this case, the second section may be connected to the first section by soldering or a connector, and the fourth section may be connected to the third section also by soldering or a connector, which is not limited in the present disclosure.

In an alternative embodiment, at least one of the second section of the first branch and the fourth section of the second branch may also be printed on the PCB 300, which includes the following three scenarios.

In a first scenario, the second section is printed on the PCB 300 and the fourth section (i.e., the antenna 200) is implemented in the form of a cable or flexible printed circuit outside the PCB 300. In this case, the first section and the second section may be integrally formed on the PCB 300 as one piece, and the fifth terminal 1141 of the output unit 114 may be connected to the second section by soldering or a connector.

In a second scenario, the second section is implemented in the form of a cable or flexible printed circuit outside the PCB 300, and the fourth section (i.e., the antenna 200) is implemented by a signal line printed on the PCB. In this case, the sixth terminal 1142 of the output unit 114 may be connected to the fourth section by soldering or a connector. The signal line may be a strip line or a micro strip line printed on the PCB 300 according to some embodiments.

In a third scenario, the second section and the fourth section (i.e., the antenna 200) each are a signal line printed on the PCB. The second section and the first section may be integrally formed on the PCB 300 as one piece, and the fourth section (i.e., the antenna 200) and the third section may also be integrally formed on the PCB 300 as one piece. In this case, the fifth terminal 1141 of the output unit 114 may be connected to the second section by soldering or a connector, and the sixth terminal 1142 of the output unit 114 may be connected to the fourth section also by soldering or a connector. The signal line may be a strip line or a micro strip line printed on the PCB 300 according to some embodiments.

From the above description, the antenna 200 may be implemented in the form of a cable or a flexible printed circuit or in the form of a signal line printed on the PCB 300. In both case, a dedicated or an independent antenna is not required for the second circuit 120 which is a radio frequency circuit. As part of the first circuit 110 is shared with the second circuit 120 to function as an antenna for the second circuit 120, smaller size and better industrial design can be achieved for the electronic device.

As described above, the first electronic component 200 is multiplexed as an antenna in the second circuit 120, so that smaller size and better industrial design are achieved for the electronic device 100 with the RF performance of the electronic device 100 not affected, by the technical solutions according to the present disclosure, which is described in detail hereinafter with the electronic device being a wireless earbud (earphone) for example, though the electronic device may be other devices, such as smart watches, VR (Virtual Reality) glasses, AR (Augmented Reality) glasses, other smart glasses or wearable GPS devices.

In an embodiment, the first RF module 123 is a Bluetooth module, and accordingly, the second signal is a Bluetooth signal of a radio frequency typically around 2.44 GHz. In this embodiment, the output unit 114 may be a speaker of a wireless earbud, and the first signal may be an audio signal of a first frequency that typically ranges from 20 Hz to 20 kHz. In this case, the first filter 113 and the second filter 115 may be properly designed so as to more effectively filter out the Bluetooth signal and thereby prevent interference of the Bluetooth signal on the audio signal, which is not described herein for purpose of brevity. In addition, a capacitance of the capacitor 124 may be around 100 pF, preferably, and a specific value of the capacitance may be determined according to actual needs, which is not limited in the present disclosure.

The Bluetooth signal of the frequency of 2.44 GHz has a wavelength of 122 mm though the wavelength may vary about 122 mm depending on a specific frequency of the Bluetooth signal. Therefore, a length of a λ/4 monopole antenna for the Bluetooth signal is about 30.5 mm, where λ, is the wavelength of the Bluetooth signal, but wavelength shortening need be taken into consideration when determining a length of the antenna 200 (i.e., the fourth section of the second branch of the first circuit 110). Accordingly, the length of the antenna 200 may be between 15 mm and 35 mm, which is proper for a wireless earbud. Moreover, when the length of the antenna is short or long compared with resonance frequency, the resonance frequency can be adjusted by using an inductor or a capacitor on the antenna matching circuit 125. When the length of the antenna is short, the inductor is provided in series. When the length of antenna is long, the capacitor is provided in series. In this way, the resonance frequency can be adjusted by the antenna matching circuit when the antenna length is differed slightly. In a case that the technical solution is applied to other electronic devices, and there is need to change the length of the antenna due to an audio or ID/product design matter, RF performance can be maintained by optimization with the antenna matching circuit 125.

In a conventional wireless earbud, a dedicated or independent antenna is required for the Bluetooth module and space for mounting the antenna is thus needed beyond the speaker and the PCB, which results in large size and poor industrial design of the wireless earbud. By applying the technical solutions according to the present disclosure, such a dedicated or independent antenna is not required for the Bluetooth module, rather its functionality can be implemented or integrated into a part of the audio circuit, thereby resulting in smaller size and better industrial design for the wireless earbud. In addition, the performance of this "shared" antenna can be maintained as good as the dedicated or independent antenna in the conventional wireless earbud, as is reflected in FIG. 7 and FIGS. 8a to 8d.

Figure 7:
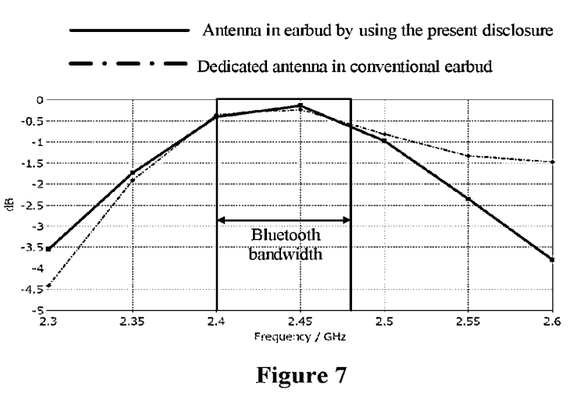
FIG. 7 is a diagram showing comparison between antenna efficiencies of conventional electronic device and the electronic device according to an embodiment of the present disclosure.

FIG. 7 is a graph showing comparison between efficiencies of the antenna 200 according to the present disclosure and the dedicated or independent antenna in the conventional wireless earbud. As can be seen, the efficiency of the antenna 200 according to the present disclosure is very much close to the efficiency of the dedicated or independent antenna in the conventional wireless earbud in the frequency range of Bluetooth bandwidth. In particular, in the frequency range of 2.4 GHz to 2.48 GHz, the efficiency of the antenna 200 is almost the same as the efficiency of the dedicated or independent antenna in the conventional wireless earbud.

Figure 8A:
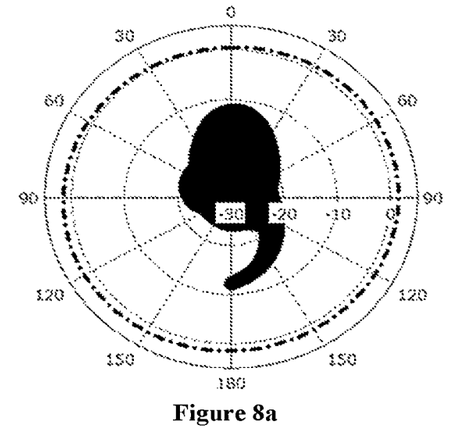
FIGS. 8a and 8b show a radiation pattern of an antenna in a conventional electronic device.
Figure 8B:
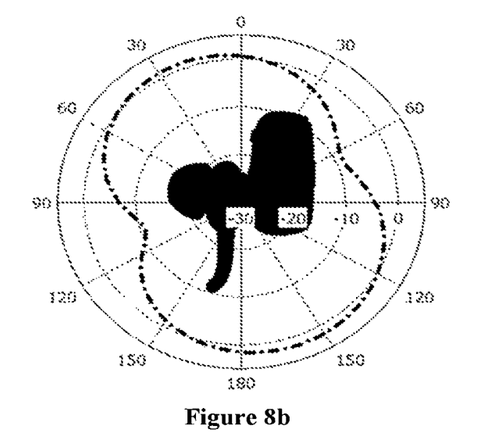
Figure 8C:
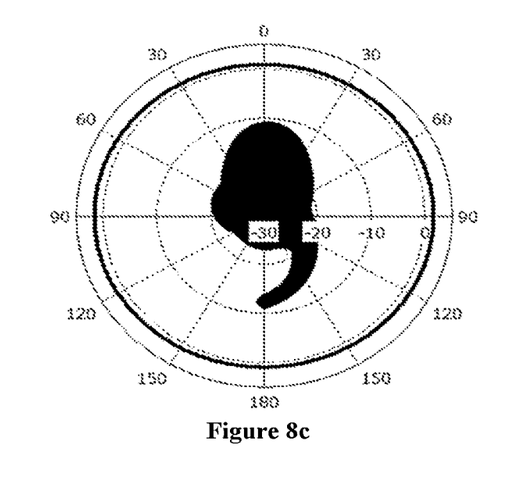
FIGS. 8c and 8d show a radiation pattern of an antenna in an electronic device according to an embodiment of the present disclosure.
Figure 8D:
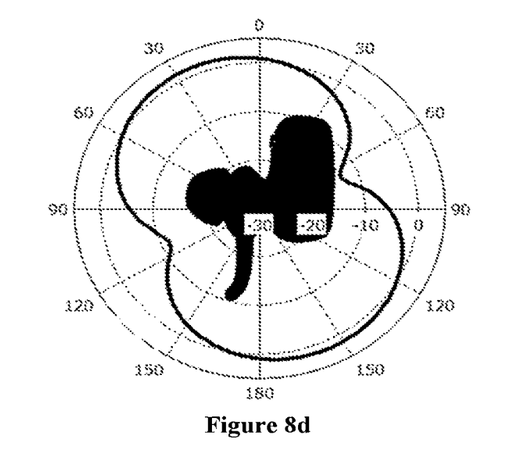

FIGS. 8a and 8b show a radiation pattern of the dedicated or independent antenna in the conventional wireless earbud, and FIGS. 8c and 8d show a radiation pattern of the antenna 200 according to the present disclosure. As can be seen from FIGS. 8a to 8d, the radiation pattern of the antenna 200 is substantially the same as the radiation pattern of the dedicated or independent antenna in the conventional wireless earbud.

From the above comparison between the antenna 200 according to the present disclosure and the dedicated or independent antenna in the conventional wireless earbud, smaller size and better industrial design can be achieved for the electronic device with the RF performance maintained as good as the conventional wireless earbud.

In other embodiments, the first RF module 123 may be a Wireless LAN module, or a GPS module. The above configuration of the electronic device 110 and the performance comparison also apply in a case of a Wireless LAN module or a GPS module, as a Wireless LAN signal or GPS signal has a frequency almost to a frequency of a Bluetooth signal.

Figure 9:
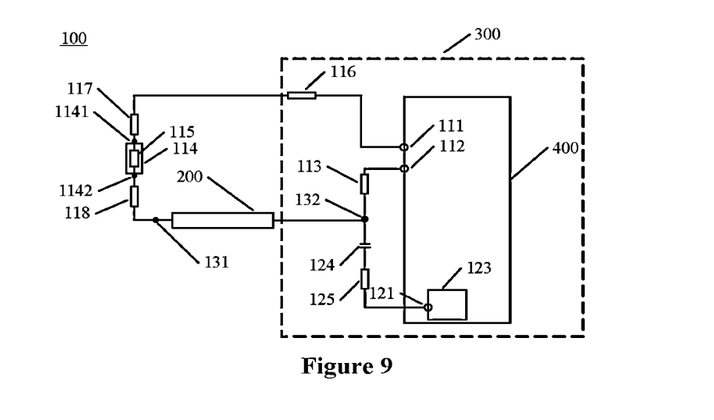
FIG. 9 is a schematic diagram of an electronic device according to an embodiment of the present disclosure.

In an embodiment based on the above embodiments, as shown in FIG. 9, a third filter 116 configured to filter out RF signals may be further provided between the output unit 114 and the first terminal 111 of the first circuit 110. The third filter 116 may be provided on the PCB 300 (for example, in the first section of the first branch of the first circuit 110) or outside the PCB 300 (for example, in the second section of the first branch of the first circuit 110), so as to prevent noise or interference from the antenna 200. In some embodiments, the third filter 116 may be a Ferrite bead or a choke coil.

In an embodiment based on the above embodiments, a fourth filter 117 may be further provided between the output unit 114 and the first terminal 111 of the first circuit 110 and configured to filter out radio frequency signals, as is shown in FIG. 9. The fourth filter 117 is arranged at a first predetermined distance from the output unit 114, where the first predetermined distance is smaller than a distance between the fourth filter 117 and the first terminal 111 of the first circuit 110, so that the fourth filter 117 is closer to the output unit 114 than to the first terminal. That is, a ratio of the first predetermined distance to the distance between the fourth filter 117 and the first terminal 111 is smaller than one. The first predetermined distance and the ratio may be determined by those skilled in the art according to practical requirements or restrictions, for example, according to dimensions of the electronic device 100. In an example, the first predetermined distance may be 2 cm or less.

Provision of the fourth filter 117 can better prevent the interference of the radio frequency signal on the audio signal, in case that the second filter 115 in the output unit is insufficient to cut the radio frequency signal. Further, a fifth filter 118 configured to filter out radio frequency signals may be further provided between the output unit 114 and the antenna 200 (more precisely, between the sixth terminal 1142 of the output unit 114 and the first point 131 of joint connection), as is shown in FIG. 9. The fifth filter 118 may be arranged at a second predetermined distance from the output unit 114, where the second predetermined distance is smaller than a distance between the fifth filter 118 and the first point 131 of joint connection. That is, the fifth filter 118 is closer to the output unit 114 than to the first point 131 of joint connection. In an example, the second predetermined distance may be 2 cm or less.

In some embodiments, the fourth filter 117 and the fifth filter 118 each may be a Ferrite bead or a choke coil.

Although all shown in FIG. 9, it may be the case that one or more of the third filter 116, the fourth filter 117 and the fifth filter 118 may be present in the electronic device. For example, in some embodiments, only one of the third filter 116, the fourth filter 117 and the fifth filter 118 may be present in the electronic device. For example, in some embodiments, two of the third filter 116, the fourth filter 117 and the fifth filter 118 may be present in the electronic device. Provision of the third filter 116, the fourth filter 117 and the fifth filter 118 may be configured adaptive to practical technical requirement, such as interference requirements.

In some embodiments, the electronic device further includes a housing with a metal chassis, and a grounding terminal on the PCB 300 is connected to the metal chassis by a contact component, such as a pogo pin or a spring. For example, the electronic device 100 may be a wireless earbud.

Figure 10:
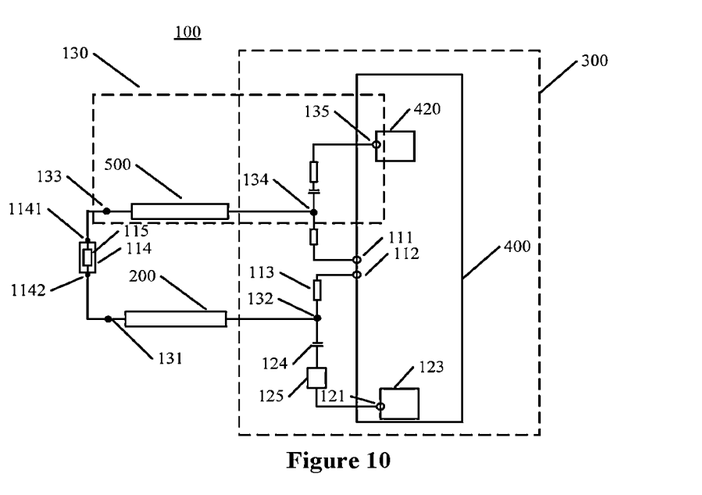
FIG. 10 is a schematic diagram of an electronic device according to an embodiment of the present disclosure.

In the above embodiments as described, the first electronic element 200 is shared between the first circuit 110 and the second circuit 120. In an embodiment based on the above embodiments, the electronic device 100 may further include a third circuit 130 operating on a third signal of a third frequency, and the first circuit 110 and the third circuit 130 share a second electronic element 500, as is shown in FIG. 10.

The third frequency is different from the first frequency. In an embodiment, the third frequency is radio frequency, and the second electronic element 500 may be an antenna. The electronic device may further include a second RF module 420 connected to the antenna 500. The second RF module 420 may be different from the first RF module, such as, cellular module, wireless LAN module, Bluetooth module or GPS module. As can be seen, the antenna 500 may be the second section of the first branch of the first circuit 110. Similar to the fourth section of the second branch of the first circuit 110, the second section may be a cable or a flexible printed circuit connecting the output unit 114 to the PCB 300, or a signal line printed on the PCB 300. Reference can be made to the description of the fourth section for detailed implementation of the second section.

The third circuit 130 includes a fifth terminal 135 connected to the RF module 420, and the antenna 500 is arranged between a third point 133 of joint connection and a fourth point 134 of joint connection of the first circuit 110 and the third circuit 130. Like in the foregoing embodiments, a capacitor may be provided between the fourth point 134 of joint connection and the fifth terminal 135. In a further embodiment, an antenna matching circuit may be provided between the fourth point 134 of joint connection and the fifth terminal 135. As can be understood, reference may be made to the related description of the capacitor 124 and the antenna matching circuit 125 in the foregoing embodiments for the functionality of the capacitor and the antenna matching circuit in the third circuit 130. In addition, a high pass filter or band pass filter for filtering out the first signal may be further provided between the fourth point 134 of joint connection and the fifth terminal 135.

As can be seen from the above description, in this embodiment, the first branch and the second branch of the first circuit 110 each has a portion that functions as an antenna, thereby further reducing the space occupied by a dedicated or independent antenna in the electronic device. It shall be appreciated that more than two elements of the first circuit 110 may be shared with other circuits to implement additional functions, for example, as antenna, and that reference can be made to foregoing embodiments for implementation of sharing of more than two elements of the first circuit, which is not elaborated herein.

The electronic device provided according to any of the above embodiments will be described in terms of physical configuration hereinafter. It is understandable that the physical aspects described hereinafter may be combined with any of the above embodiments, where appropriate.

Figure 11:
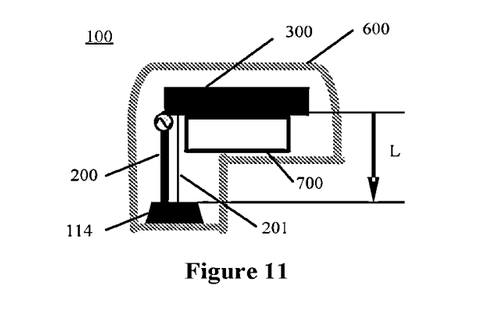
FIG. 11 is a schematic structural diagram of an electronic device according to an embodiment of the present disclosure.

As shown in FIG. 11, the electronic device 100 according to an embodiment of the present disclosure includes a housing 600, a PCB 300, and an output unit 114. The output unit 114 is connected to a first output port and a second output port both for the output unit 114 on the PCB 300 through a first connection portion 200 and a second connection portion 201, respectively.

The first connection portion 200 is the antenna 200 (which will be referred to as a first antenna 200 hereinafter for purpose of ease of description) as described in the above embodiments. That is, the output unit 114 is connected to the first output port on the PCB 300 for the output unit 114 through the first antenna 200. The first antenna 200 as described above operates on a radio frequency signal, and the output unit 114 operates on a signal of a frequency that is different from a radio frequency. It is understandable that the radio frequency signal on which the first antenna 200 operates and the signal on which the output unit 114 operates can be isolated from each other by the various filters configured in the foregoing embodiments, which is not repeated herein for purpose of conciseness.

In the embodiment as shown in FIG. 11, the electronic device 100 is a wireless earbud and the output unit 114 is a speaker of the wireless earbud, while in other embodiments, the electronic device 100 may be a smart watch or a smart band with a display, and the output unit 114 is the display of the smart watch or smart band, which is not limited in the present disclosure.

As similar to the above-described embodiments, the first antenna 200 may be a cable or a flexible printed circuit connecting the output unit 114 to the first output port on the PCB 300; or the first antenna 200 may be a signal line printed on the PCB 300, and the signal line is a strip line or a micro strip line. For a radio frequency around 2.44 GHz, a length L of the first antenna 200 may be between 15 mm to 35 mm. Reference may be made to the descriptions in the foregoing embodiments for more detail.

In an embodiment, the housing 600 may include a metal chassis 601 and a non-metallic portion 602. The non-metallic portion is necessary as electromagnetic transmission of the first antenna 200 will be blocked if the housing 600 is made entirely of metal. The non-metallic portion 602 may be made of any suitable non-metallic material, such as plastic, ceramics and so on, which is not limited in the present disclosure. The metal chassis 601 and the non-metallic portion 602 may be formed separately and assembled together thereafter.

Figure 12:
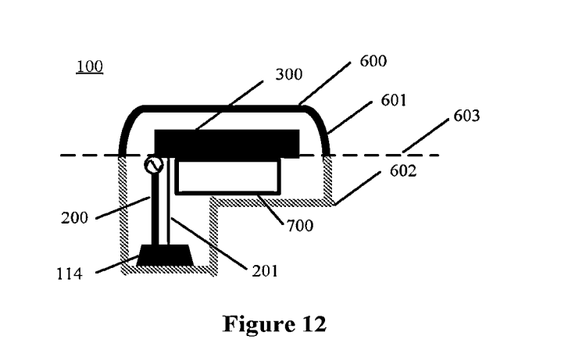
FIG. 12 is a schematic structural diagram of an electronic device according to an embodiment of the present disclosure.

As shown in FIG. 12, the metal chassis 601 encompasses the PCB 300, and the non-metallic portion 602 encompasses at least the first antenna 200. To be more specific for clearer understanding, an imaginary plane 603 may be presented, which is denoted by the dotted line in FIG. 12 from a front view. The PCB 300 is arranged above the imaginary plane and the first antenna 200 and the output unit 114 are arranged below the imaginary plane 603. Accordingly, a part of the housing 100 above the imaginary plane 603 is the metal chassis 601, and a part of the housing 100 below the imaginary plane 603 is the non-metallic portion 602 of the housing 600. The division above is merely exemplary without constituting a limitation on the present disclosure. In practical, the size of the metal chassis 601 may be smaller than that as shown in FIG. 12, while the size of the non-metallic portion 602 shall be no less than that shown in FIG. 12 in order to avoid blocking the electromagnetic transmission of the first antenna 200, preferably.

In an embodiment, the metal chassis 601 is connected to a grounding terminal on the PCB 300 by a contact component. As already described in the foregoing embodiments, the contact component may be a pogo pin or a spring, which is not limited in the present disclosure.

In an alternative embodiment, the housing 600 may be formed integrally with a non-metallic material, such as plastic, ceramics and so on.

Figure 13:
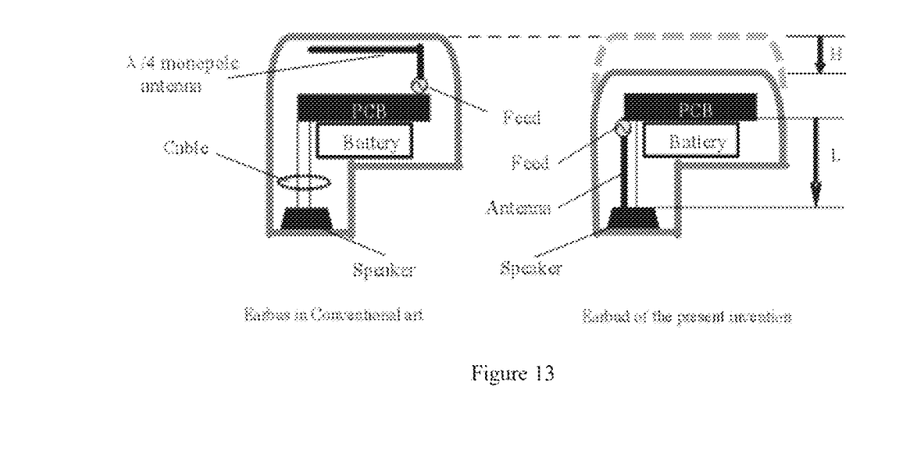
FIG. 13 is a diagram shown comparison between dimensions of a conventional earbud and a wireless earbud according to the present disclosure.

FIG. 13 shows a comparison of dimensions of a conventional wireless earbud and a wireless earbud according to the present disclosure. As can be seen from the comparison, the dedicated or independent antenna (i.e., the λ/4 monopole antenna) is not needed in the wireless earbud 100 according to the present disclosure as the cable connecting the speaker to the PCB is used as an antenna, and therefore, the height of the wireless earbud according to the present disclosure is reduced by H compared with the conventional wireless earbud with a dedicated or independent antenna.

Figure 14A:
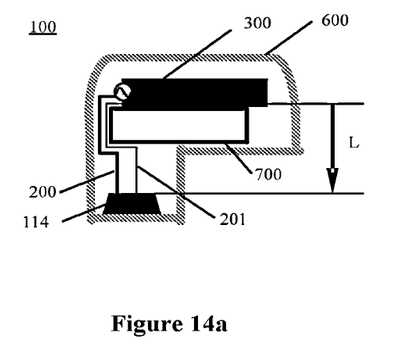
FIG. 14a is a schematic structural diagram of an electronic device according to an embodiment of the present disclosure.
Figure 14B:
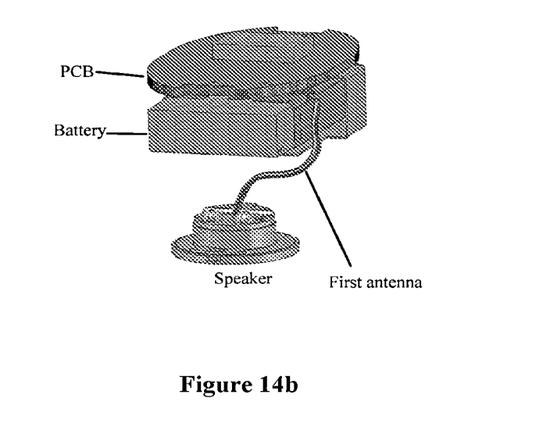
FIG. 14b is a stereoscopic structural view of part of an electronic device according to an embodiment of the present disclosure.

As can be understood, in practical applications, the wireless earbud 100 includes a battery 700 for power supply, and as shown in FIG. 11, the battery 700 may be arranged below the PCB 300. The shape of the first antenna 200 may be affected by the size of the battery 700. In the wireless earbud 100 as shown in FIG. 11, the first antenna 200 is configured as a straight line due to the relatively small size of the battery 700. In another embodiment, as shown in FIG. 14a, the battery 700 may have such a shape that at least a part of the first antenna 200 follows a part of the contour of the battery 700, in which case the first antenna is not a straight line but a curved one. FIG. 14b shows an actual view of the wireless earbud 100 without the housing 600. It should be noted that whether the first antenna 200 is straight or curved may be configured based on the size of the battery 700 and is not limited in the present disclosure.

Figure 15:
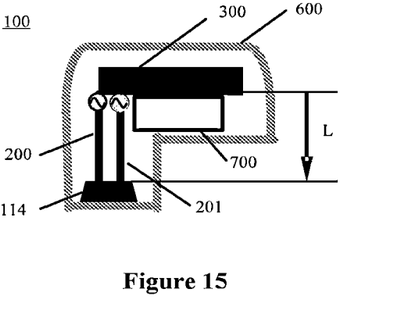
FIG. 15 is a schematic structural diagram of an electronic device according to an embodiment of the present disclosure.

In an embodiment, as shown in FIG. 15, the second connection portion 201 may also be used as an antenna, which may be referred to as a second antenna 201 for purpose of clearer description. The second antenna 201 and the first antenna 200 may be connected to a same radio frequency module on the PCB or to different radio frequency modules on the PCB 300, which is not limited in the present disclosure. It should be understood that the second antenna 201 may be configured in the same manner as the first antenna 200 as described in the foregoing embodiment. For example, the second antenna 201 may has the same length L as the first antenna 200.

The embodiments are described in a progressive manner, and reference may be made to each other of the embodiments for similar or same elements among the embodiments. According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but conforms to a widest scope as defined by the appended set of claims.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

The invention claimed is:

1. An electronic device, comprising a first circuit operating on a first signal of a first frequency and a second circuit operating on a second signal of a second frequency, wherein the first frequency is different from the second frequency, and the first circuit and the second circuit share a first component,
   wherein the second signal is a radio frequency signal, and the first component is an antenna for the radio frequency signal, and
   wherein the first circuit comprises an output unit, the antenna is arranged between the output unit and a point of joint connection of the first and second circuits.

2. The device according to claim 1, wherein the first circuit comprises a first terminal and a second terminal, and further comprises a first filter arranged between the second terminal and a point of joint connection of the first and second circuits, the first filter configured to filter out radio frequency signals.

3. The device according to claim 1, wherein the second circuit comprises a third terminal and further comprises a capacitor arranged between the point of joint connection and the third terminal.

4. The device according to claim 3, wherein the second circuit further comprises an antenna matching circuit between the point of joint connection and the third terminal.

5. The device according to claim 3, further comprising a printed circuit board (PCB), wherein the first to third terminals are arranged on an integrated circuit on the PCB, the first circuit further comprise a fifth filter arranged on the PCB and between the fourth filter and the first terminal, wherein the fifth filter is configured to filter out radio frequency signals.

6. The device according to claim 5, further comprising a housing with a metal chassis, wherein the metal chassis is connected to a grounding terminal on the PCB by a contact component.

7. The device according to claim 3, further comprising a radio frequency module, wherein the third terminal is connected to the radio frequency module.

8. The device according to claim 3, wherein the radio frequency module is a Bluetooth module, a wireless LAN module or a GPS module.

9. The device according to claim 1, wherein the output unit comprises a second filter configured to filter out radio frequency signals.

10. The device according to claim 1, wherein the second circuit further comprises a third filter arranged between the output unit and the antenna and at a first predetermined distance from the output unit, wherein the third filter is configured to filter out radio frequency signals and the first predetermined distance is smaller than a distance between the third filter and the antenna.

11. The device according to claim 1, wherein the first circuit further comprises a fourth filter configured to filter out radio frequency signals, and the fourth filter is arranged between the output unit and the first terminal and at a second predetermined distance from the output unit, wherein the second predetermined distance is smaller than a distance between the fourth filter and the first terminal.

12. The device according to claim 1, wherein a length of the antenna is between 15 mm to 35 mm.

13. The device according to claim 1, wherein the antenna is a cable or a flexible printed circuit connecting the output unit to the point of joint connection.

14. The device according to claim 1, further comprising a PCB, wherein the antenna is a signal line printed on the PCB, and the signal line is a strip line or a micro strip line.

15. The device according to claim 1, further comprising a third circuit operating on a third signal of a third frequency, wherein the first and third circuits share a second component of the first circuit, the third signal is a radio frequency signal, and the second component is an antenna for the radio frequency signal.

16. An electronic device, comprising a housing, a PCB, an output unit mounted on the housing, and a first antenna, wherein the first antenna operates on a radio frequency signal, the output unit operates on a signal of a frequency that is different from a radio frequency, and the output unit is connected to a first output port on the PCB for the output unit through the first antenna.

17. The electronic device according to claim 16, wherein the housing comprises a metal chassis and a non-metallic portion, and the non-metallic portion encompasses at least the first antenna.

18. The electronic device according to claim 16, further comprising a second antenna, wherein the output unit is further connected to a second output port on the PCB for the output unit through the second antenna.

* * * * *